United States Patent
Chen

(10) Patent No.: US 10,833,015 B2
(45) Date of Patent: Nov. 10, 2020

(54) 3D NAND WORD LINE CONNECTION STRUCTURE

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/879,541

(22) Filed: May 20, 2020

(65) Prior Publication Data

US 2020/0279810 A1     Sep. 3, 2020

Related U.S. Application Data

(62) Division of application No. 15/960,106, filed on Apr. 23, 2018, now Pat. No. 10,700,004.

(51) Int. Cl.
*H01L 23/528*     (2006.01)
*H01L 27/11519*   (2017.01)
(Continued)

(52) U.S. Cl.
CPC .... *H01L 23/5283* (2013.01); *H01L 27/11519* (2013.01); *H01L 27/11548* (2013.01);
(Continued)

(58) Field of Classification Search
None
See application file for complete search history.

(56) References Cited

U.S. PATENT DOCUMENTS 6,906,940 B1   6/2005  Lue
7,315,474 B2   1/2008  Lue
(Continued)

FOREIGN PATENT DOCUMENTS

EP   2048709 A2   4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.

(Continued)

*Primary Examiner* — Mounir S Amer
(74) *Attorney, Agent, or Firm* — Haynes Beffel & Wolfeld LLP

(57) ABSTRACT

A memory device comprises a stack of linking elements including a first group of linking elements and a second group of linking elements different than the first group of linking elements. Interlayer connectors in a first plurality of interlayer connectors are connected to respective linking elements in the first group of linking elements. Interlayer connectors in a second plurality of interlayer connectors are connected to linking elements in the second group of linking elements. Patterned conductor lines in a first layer of patterned conductor lines are coupled to respective interlayer connectors in the first plurality of interlayer connectors. Patterned conductor lines in a second layer of patterned conductor lines disposed higher than the first layer of patterned conductor lines are coupled to respective interlayer connectors in the second plurality of interlayer connectors.

10 Claims, 10 Drawing Sheets

(51) Int. Cl.
  *H01L 27/11575* (2017.01)
  *H01L 27/11565* (2017.01)
  *H01L 27/11548* (2017.01)
  *H01L 27/11582* (2017.01)
  *H01L 27/11556* (2017.01)
  *H01L 27/11524* (2017.01)
  *H01L 27/1157* (2017.01)

(52) U.S. Cl.
  CPC .. *H01L 27/11565* (2013.01); *H01L 27/11575* (2013.01); *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 7,420,242 | B2 | 9/2008 | Lung |
| 7,696,559 | B2 | 4/2010 | Arai et al. |
| 7,851,849 | B2 | 12/2010 | Kiyotoshi |
| 8,013,383 | B2 | 9/2011 | Kidoh et al. |
| 8,363,476 | B2 | 1/2013 | Lue et al. |
| 8,467,219 | B2 | 6/2013 | Lue |
| 8,503,213 | B2 | 8/2013 | Chen et al. |
| 8,759,899 | B1 | 6/2014 | Lue et al. |
| 9,224,473 | B1* | 12/2015 | Chen .................. G11C 16/0466 |
| 9,397,110 | B2 | 7/2016 | Lue |
| 9,472,286 | B2 | 10/2016 | Chen |
| 10,700,004 | B2 | 6/2020 | Chen |
| 2005/0280061 | A1 | 12/2005 | Lee |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0007588 | A1 | 1/2011 | Li et al. |
| 2012/0068241 | A1 | 3/2012 | Sakuma et al. |
| 2012/0119283 | A1 | 5/2012 | Lee et al. |
| 2012/0193681 | A1 | 8/2012 | Or-Bach |
| 2012/0299086 | A1 | 11/2012 | Lee |
| 2014/0361241 | A1* | 12/2014 | Sasago ................ H01L 27/2481 257/5 |
| 2015/0214239 | A1 | 7/2015 | Rhie |
| 2017/0200676 | A1* | 7/2017 | Jeong ................ H01L 21/76816 |
| 2017/0287833 | A1* | 10/2017 | Thimmegowda ............................ H01L 27/11548 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash 4pplic.ation," 2009 IEEE, Dec. 7-9, 2009, pp. 27.4.1-27 4 4.

Hubert et al., "A Stacked Sonos Technology, Up to 4 Levels and 6nm Crystalline Nanowires, With Gate-All-Around on Independent Gates (Flash), Suitable for Full 3D Integration," IEEE 2009, Dec. 7-9, 2009, pp. 27.6.1-27.6.4.

Hung et al., "A highly scalable vertical gate (VG) 3D Nand Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked Nand Flash Memory Technology Using Stacking Single Crystal Si Layers on ILD and TANOS Structure for Beyond 30nmNode," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VSLI Technology Digest of Technical Papers, Jun. 16-18, 2009, pp. 136-137. cited byapplicant.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Japers, pp. 186-187. cited byapplicant.

Kim et al., "Multi-Layered Vertical Gate NAND Flash Overcoming Stacking Limit for Terabit Density Storage,"2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and Pipe (Planarized Integration on the same PlanE)," IEEE 2008 Symposium on VLSI Technology Digest of Technical Papers, Jun. 17-19,2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel Be-Sonos Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H, et al., "Bit Cost Scalable Technology with Punch and Plug Process for Ultra High Density Flash Memory," 2007 Symp. VLSI Tech., Digest of Tech. Papers, pp. 14-15.

Nang, Michael, "Technology Trends on 3D-Nand Flash Storage", Impact 2011, Taipei, dated Oct. 20, 2011, found at www.impact.org.tw/2011/Files/NewsFile/201111110190.pdf.

* cited by examiner

3D NAND WORD LINE CONNECTION STRUCTURE

PRIORITY APPLICATION

This application is a divisional of U.S. patent application Ser. No. 15/960,106 filed 23 Apr. 2018(now U.S. Pat No. 10,700,004); which application is incorporated herein by reference.

BACKGROUND

Field

The present invention relates to high density memory devices, and particularly to memory devices in which multiple planes of memory cells are arranged to provide a three-dimensional 3D array

Description of Related Art 3D memory devices have been developed in a variety of configurations that include vertical channel structures. In vertical channel structures, memory cells including charge storage structures are disposed at interface regions between horizontal planes of conductive strips arranged as word lines, string select lines, and ground select lines, and vertical active strips including channels for the memory cells. Bit lines are coupled to the vertical channel structures.

The memory cells are disposed in blocks in a 3D memory device. A block size can be represented as $N_{BL}*N_{WL}*N_{SSL}$, where $N_{BL}$ represents the number of bit lines that can be processed in parallel in a block, and $N_{WL}$ represents the number of horizontal planes of conductive strips arranged as word lines in the block. $N_{SSL}$ represents the number of string select lines in the block, and is proportional to $N_{WL}$ because of requirements by layout of staircase contacts. A larger $N_{BL}$ indicates more bit lines can be read from or written to a page buffer in parallel. A larger $N_{WL}$ indicates a greater capacity in a memory device. Pass voltage (Vpass) disturb in read operations increases with $N_{SSL}$. A smaller $N_{SSL}$ can result in lower Vpass disturb in read operations and lower power consumption.

Staircase contacts on staircase structures can connect word lines to metal lines in a metal layer, which can in turn be connected to word line drivers. Due to deep etch requirements, it is difficult to shrink the size of staircase contacts on the staircase structures in order to reduce $N_{SSL}$.

In some NAND architectures, a block is a minimum unit for an erase operation and for repair along a word line direction in a block. A larger block size can incur higher repair cost in a block. A larger block size can also increase capacitance between word lines. Increased capacitance can cause higher RC delays, lower operating speeds, higher read/write disturbance, and higher power consumption.

To reduce the block size of a block, a multi-column contact window can be used instead of a single-column contact window to reduce the width of a block without changing the design rule for staircase contacts in a single-column contact window. For instance, a block having six staircase contacts in a single-column contact window can have a width of Y, while a block having the six staircase contacts in a two-column contact window of three staircase contacts each can have a width of Y/2. The design rule for staircase contacts in a multi-column contact window can remain unchanged from a single-column contact window.

However, since the width of the block is reduced with a multi-column contact window, a metal word line pitch for metal lines at a metal layer connected to staircase contacts in a multi-column contact window is also reduced. This is because a number of metal lines connected to staircase contacts within the width of the block remains the same as with a single-column contact window. Here the metal lines are arranged for connecting the conductive strips in the horizontal planes of conductive strips arranged as word lines to a word line decoder. Since a high voltage is applied on the metal lines, the reduction on the metal word line pitch may increase the electric fields between adjacent metal lines and interfere with read, write and erase operations using the metal lines.

For instance, a multi-column contact window has three rows by four columns of contacts. Each row in the window has a staircase pitch. Four contacts in a row in the window are connected to four metal lines in a metal layer, where the metal lines have a metal word line pitch equal to ¼ of the staircase pitch. In comparison, metal lines connected to staircase contacts in a single-column contact window can have a metal word line pitch equal to the staircase pitch. Since a high voltage is applied on the metal lines, electric fields from adjacent metal lines in a metal layer may limit how much the metal word line pitch can be reduced in a multi-column contact window.

It is desirable to provide a word line connection structure for three-dimensional integrated circuit memory that can reduce the number of string select lines in a block and the block size without shrinking the staircase contacts and without increasing electric fields between adjacent metal lines arranged for word line connections.

SUMMARY

A memory device comprises a stack of linking elements including a first group of linking elements and a second group of linking elements different than the first group of linking elements. The memory device comprises a first plurality of interlayer connectors. Interlayer connectors in the first plurality of interlayer connectors are connected to respective linking elements in the first group of linking elements. The memory device comprises a second plurality of interlayer connectors. Interlayer connectors in the second plurality of interlayer connectors are connected to linking elements in the second group of linking elements. The memory device comprises a first layer of patterned conductor lines. Patterned conductor lines in the first layer of patterned conductor lines are coupled to respective interlayer connectors in the first plurality of interlayer connectors. The memory device comprises a second layer of patterned conductor lines disposed higher than the first layer of patterned conductor lines. Patterned conductor lines in the second layer of patterned conductor lines are coupled to respective interlayer connectors in the second plurality of interlayer connectors.

Interlayer connectors in the first plurality of interlayer connectors and in the second plurality of interlayer connectors are disposed in a set of rows arranged in a row direction in a staircase structure region, rows in the set of rows having a first pitch in a column direction orthogonal to the row direction. Patterned conductor lines in the first layer of patterned conductor lines and in the second layer of patterned conductor lines extend in the row direction and have a second pitch in the column direction, the second pitch having half a size of the first pitch.

The memory device comprises a first plurality of local word line drivers and a second plurality of local word line drivers disposed in a word line decoder region. The memory device comprises a third plurality of interlayer connectors, interlayer connectors in the third plurality of interlayer connectors coupled to respective local word line drivers in the first plurality of local word line drivers. The memory device comprises a fourth plurality of interlayer connectors, interlayer connectors in the fourth plurality of interlayer connectors coupled to respective local word line drivers in the second plurality of local word line drivers. Patterned conductor lines in the first layer of patterned conductor lines are coupled to respective interlayer connectors in the third plurality of interlayer connectors. Patterned conductor lines in the second layer of patterned conductor lines are coupled to respective interlayer connectors in the fourth plurality of interlayer connectors.

The stack of linking elements is disposed in a staircase structure region having a first edge opposite the word line decoder region. The first plurality of interlayer connectors is disposed in a first set of columns in the staircase structure region proximal to the first edge. The second plurality of interlayer connectors is disposed in a second set of columns in the staircase structure region distal to the first edge.

In one embodiment, the first plurality of local word line drivers can be disposed in a first set of columns in the word line decoder region proximal to the first edge of the staircase structure region, the first set of columns including adjacent columns. The second plurality of local word line drivers can be disposed in a second set of columns in the word line decoder region distal to the first edge of the staircase structure region, the second set of columns including adjacent columns.

In an alternative embodiment, the first plurality of local word line drivers can be disposed in a first set of columns in the word line decoder region, including a first column proximal to the first edge of the staircase structure region, and the second plurality of local word line drivers can be disposed in a second set of columns in the word line decoder region, including a second column adjacent the first column and distal to the first edge of the staircase structure region, wherein columns in the first set of columns alternate with columns in the second set of columns.

Patterned conductor lines in the first layer of patterned conductor lines can be coupled to respective interlayer connectors disposed in the first set of columns in the staircase structure region, and coupled to respective local word line drivers disposed in the first set of columns in the word line decoder region. Patterned conductor lines in the second layer of patterned conductor lines can be coupled to respective interlayer connectors disposed in the second set of columns in the staircase structure region, and coupled to respective local word line drivers disposed in the second set of columns in the word line decoder region.

The first set of columns in the staircase structure region can include a first column disposed proximal to the first edge of the staircase structure region, and a second column disposed distal to the first edge of the staircase structure region. The first set of columns in the word line decoder region can include a first column disposed proximal to the first edge of the staircase structure region, and a second column disposed distal to the first edge of the staircase structure region.

Patterned conductor lines in a first set of patterned conductor lines in the first layer of patterned conductor lines are coupled to respective interlayer connectors disposed in the first column of the first set of columns in the staircase structure region, and coupled to respective local word line drivers disposed in the first column of the first set of columns in the word line decoder region. Patterned conductor lines in a second set of patterned conductor lines in the first layer of patterned conductor lines are coupled to respective interlayer connectors disposed in the second column of the first set of columns in the staircase structure region, and coupled to respective local word line drivers disposed in the second column of the first set of columns in the word line decoder region.

The second set of columns in the staircase structure region includes a first column disposed proximal to the first edge of the staircase structure region, and a second column disposed distal to the first edge of the staircase structure region. The second set of columns in the word line decoder region includes a first column disposed proximal to the first edge of the staircase structure region, and a second column disposed distal to the first edge of the staircase structure region.

Patterned conductor lines in a first set of patterned conductor lines in the second layer of patterned conductor lines higher than the first layer of patterned conductor lines are coupled to respective interlayer connectors disposed in the first column of the second set of columns in the staircase structure region, and coupled to respective local word line drivers disposed in the first column of the second set of columns in the word line decoder region. Patterned conductor lines in a second set of patterned conductor lines in the second layer of patterned conductor lines higher than the first layer of patterned conductor lines are coupled to respective interlayer connectors in the second column of the second set of columns in the staircase structure region, and coupled to respective local word line drivers in the second column of the second set of columns in the word line decoder region.

The memory device comprises a plurality of stacks of conductive strips alternating with insulating strips, including a bottom plane of conductive strips, a plurality of intermediate planes of conductive strips, and a top plane of conductive strips. The memory device comprises a plurality of blocks, blocks in the plurality of blocks including respective stacks of conductive strips in the plurality of stacks of conductive strips. The memory device comprises a plurality of stacks of linking elements including the first-mentioned stack of linking elements, linking elements in the plurality of stacks of linking elements coupled to conductive strips in respective intermediate planes in the plurality of intermediate planes in respective blocks in the plurality of blocks.

The memory device comprises a plurality of global word lines, global word lines in the plurality of global word lines coupled to local word line drivers coupled to linking elements coupled to conductive strips in respective intermediate planes in blocks in the plurality of blocks, the local word line drivers including the first plurality of local word line drivers and the second plurality of local word line drivers disposed in the word line decoder region.

The memory device comprises a plurality of vertical channel structures arranged orthogonally to the plurality of stacks of conductive strips, and memory elements in interface regions at cross-points between side surfaces of the plurality of stacks and the plurality of vertical channel structures, wherein linking elements in the stack of linking elements are coupled to conductive strips in respective intermediate planes in the plurality of intermediate planes.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
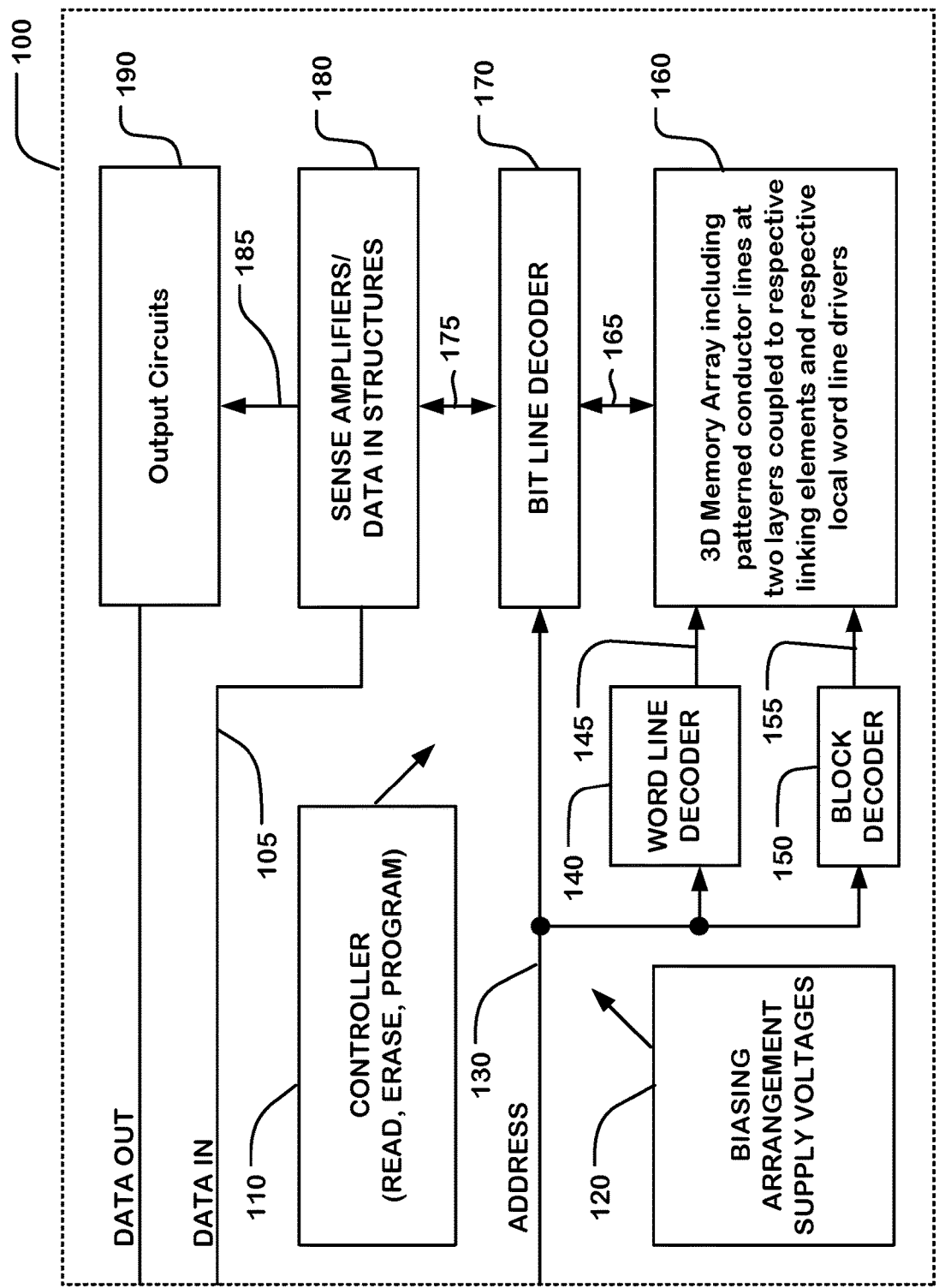
FIG. 1 is a simplified chip block diagram of an integrated circuit memory device according to an embodiment.

FIG. 1 is a simplified chip block diagram of an integrated circuit memory device 100 according to an embodiment. The memory device 100 includes a 3D memory array 160 on an integrated circuit substrate. The memory array 160 includes a stack of linking elements including a first group of linking elements (e.g. 321, 322, 323, FIG. 3) and a second group of linking elements (e.g. 324, 325, 326, FIG. 3) different than the first group of linking elements. The memory device comprises a first plurality of interlayer connectors (e.g. 321c, 322c, 323c, FIG. 3). Interlayer connectors in the first plurality of interlayer connectors are connected to respective linking elements in the first group of linking elements. The memory device comprises a second plurality of interlayer connectors (e.g. 324c, 325c, 326c, FIG. 3). Interlayer connectors in the second plurality of interlayer connectors are connected to linking elements in the second group of linking elements.

The memory device comprises a first layer of patterned conductor lines (e.g. 321p, 322p, 323p, FIG. 3), and a second layer of patterned conductor lines (e.g. 324p, 325p, 326p, FIG. 3) disposed higher than the first layer of patterned conductor lines. Patterned conductor lines in the first layer of patterned conductor lines are coupled to respective interlayer connectors in the first plurality of interlayer connectors. Patterned conductor lines in the second layer of patterned conductor lines are coupled to respective interlayer connectors in the second plurality of interlayer connectors.

Figure 6:
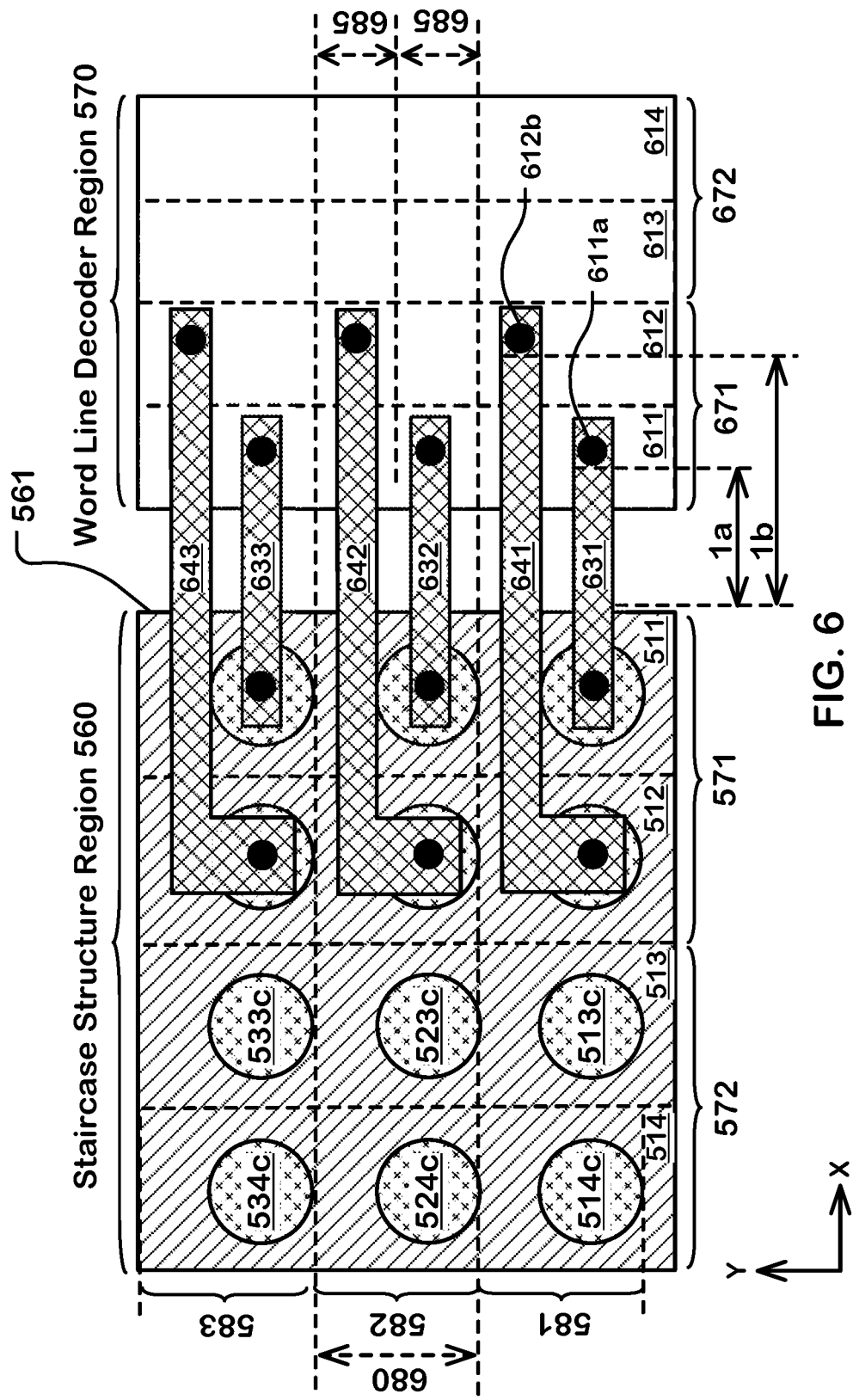
FIG. 6 illustrates a first example of arrangements for interlayer connectors, local word line drivers, and patterned conductor lines in a word line connection structure.

The memory device comprises a first plurality of local word line drivers and a second plurality of local word line drivers disposed in a word line decoder region (e.g. 570, FIG. 6). The memory device comprises a third plurality of interlayer connectors (e.g. 321d, 322d, 323d, FIG. 3), interlayer connectors in the third plurality of interlayer connectors coupled to respective local word line drivers in the first plurality of local word line drivers. The memory device comprises a fourth plurality of interlayer connectors (e.g. 324d, 325d, 326d, FIG. 3), interlayer connectors in the fourth plurality of interlayer connectors coupled to respective local word line drivers in the second plurality of local word line drivers.

Patterned conductor lines in the first layer of patterned conductor lines are coupled to respective interlayer connectors in the third plurality of interlayer connectors. Patterned conductor lines in the second layer of patterned conductor lines are coupled to respective interlayer connectors in the fourth plurality of interlayer connectors.

The memory device comprises a plurality of stacks of conductive strips alternating with insulating strips, including a bottom plane of conductive strips, a plurality of intermediate planes of conductive strips (e.g. 221-224, FIG. 2), and a top plane of conductive strips. Linking elements in the stack of linking elements (e.g. 221b-224b, FIG. 2) are coupled to conductive strips in respective intermediate planes in the plurality of intermediate planes. A word line decoder 140, including the first plurality of local word line drivers and the second plurality of local word line drivers, is coupled to word lines 145 coupled to conductive strips in the intermediate planes of conductive strips in the memory array 160 via the stack of linking elements.

A bit line decoder 170 is coupled to a plurality of bit lines 165 in the memory array 160 for reading and programming data from the memory cells in the memory array 160. A block decoder 150 is coupled to a plurality of blocks in the memory array 160 on bus 155 for selecting on which block in the plurality of blocks to execute a read, erase or program operation. Addresses are supplied on bus 130 to decoder 170, decoder 140 and decoder 150. Sense amplifiers and data-in structures in block 180 are coupled to the bit line decoder 170, in this example via data bus 175. Sensed data from the sense amplifiers are supplied via output data lines 185 to output circuits 190. Output circuits 190 drive the sensed data to destinations external to the memory device 100. Input data is supplied via the data-in line 105 from input/output ports on the memory device 100 or from other data sources internal or external to the memory device 100, such as a general purpose processor or special purpose application circuitry, or a combination of modules providing system-on-a-chip functionality supported by the 3D memory array 160, to the data-in structures in block 180.

In the example shown in FIG. 1, a controller 110 using a bias arrangement state machine controls the application of bias arrangement supply voltage generated or provided through the voltage supply or supplies in block 120, such as read and program voltages. The controller 110 can include modes of operation for programming, reading and erasing memory cells. The controller 110 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

Figure 2:
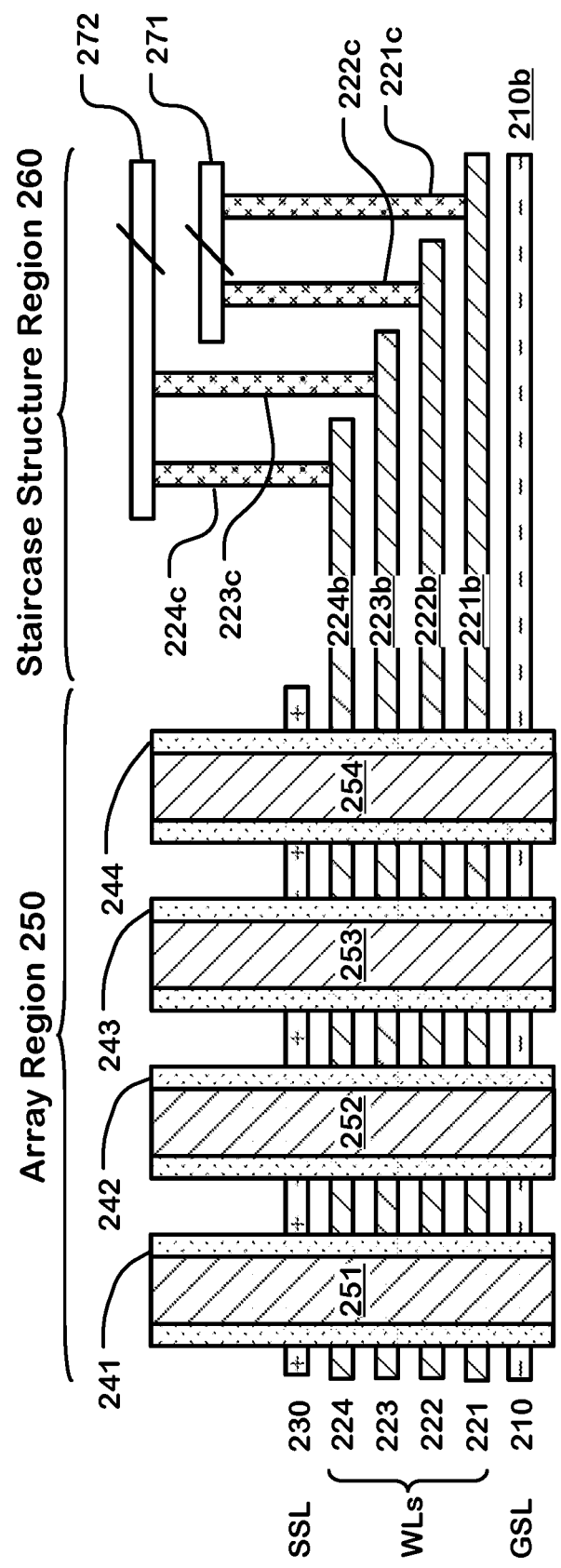
FIG. 2 illustrates a cross sectional view of an example memory device.

FIG. 2 illustrates a cross sectional view of an example memory device, including an array region 250 and a staircase structure region 260. The array region 250 includes a plurality of stacks of conductive strips alternating with insulating strips, including a bottom plane of conductive strips 210 (GSL), a plurality of intermediate planes of conductive strips 221-224 (WLs), and a top plane of conductive strips 230 (SSL). A plurality of vertical channel structures (e.g. 251-254) is arranged orthogonally to the plurality of stacks of conductive strips. Memory elements (e.g. 241-244) are disposed in interface regions at crosspoints between side surfaces of the plurality of stacks and the plurality of vertical channel structures.

A stack of linking elements (e.g. 221b-224b) is disposed in the staircase structure region 260. Linking elements in the stack of linking elements are coupled to conductive strips (e.g. 221-224) in respective intermediate planes in the plurality of intermediate planes in the array region. The stack of linking elements includes a first group of linking elements (e.g. 221b, 222b) and a second group of linking elements (e.g. 223b, 224b) different than the first group of linking elements. A linking element 210b is coupled to a conductive strip in the bottom plane 210, and coupled to a block decoder (1150, FIG. 1).

A first plurality of interlayer connectors (e.g. 221c, 222c) is disposed in the staircase structure region 260. Interlayer connectors in the first plurality of interlayer connectors are connected to respective linking elements in the first group of linking elements (e.g. 221b, 222b). A second plurality of interlayer connectors (e.g. 223c, 224c) is disposed in the staircase structure region 260. Interlayer connectors in the second plurality of interlayer connectors are connected to respective linking elements in the second group of linking elements (e.g. 223b, 224b). The first plurality of interlayer connectors and second plurality of interlayer connectors are further described in reference to FIGS. 3-9.

A first layer of patterned conductor lines 271 includes patterned conductor lines coupled to respective interlayer connectors in the first plurality of interlayer connectors. A second layer of patterned conductor lines 272 disposed higher than the first layer of patterned conductor lines 271 includes patterned conductor lines coupled to respective interlayer connectors in the first plurality of interlayer connectors. The first and second layers of patterned conductor lines are further described in reference to FIGS. 3-4 and 6-9.

Figure 3:
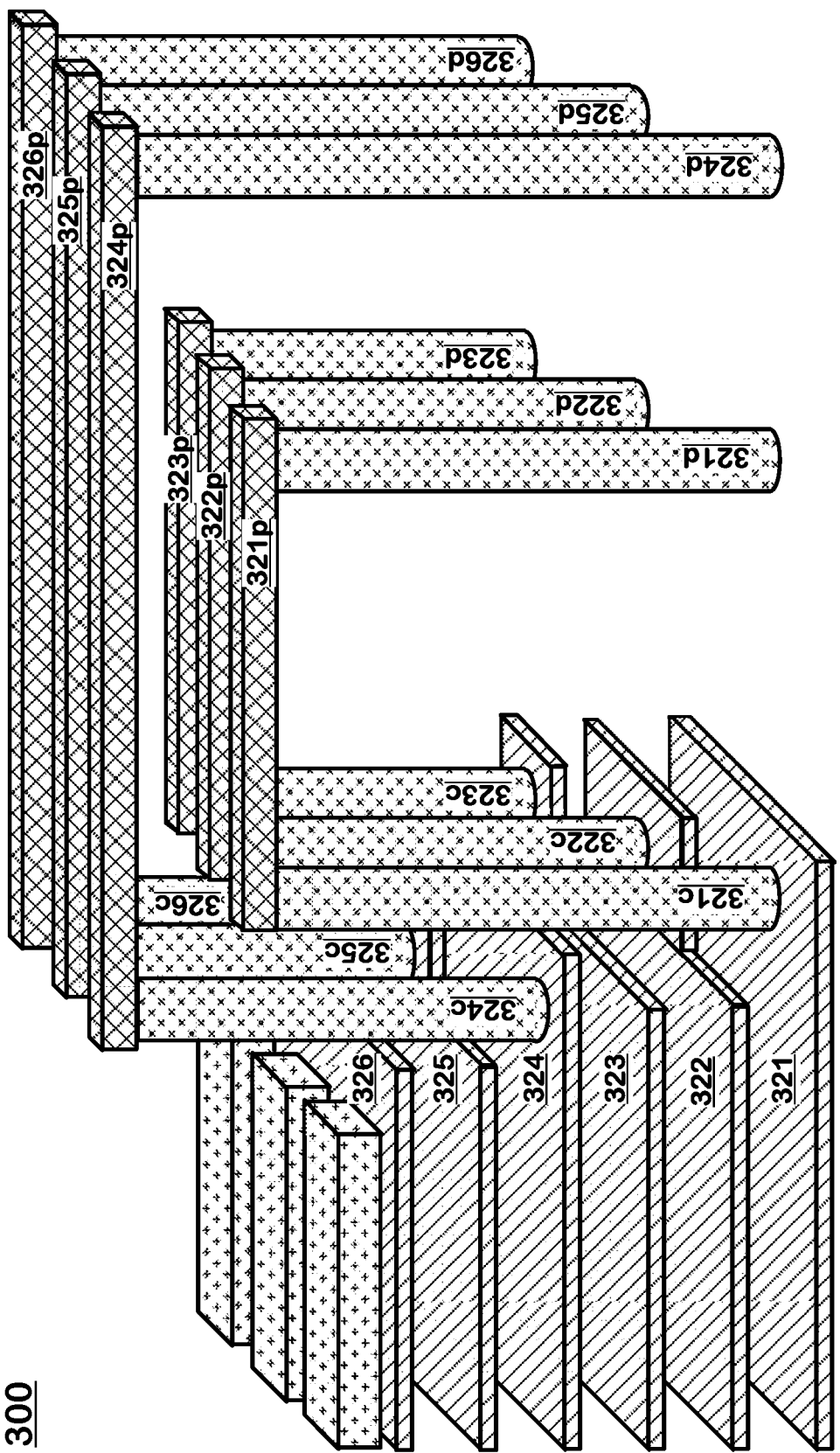
FIG. 3 illustrates a perspective view of an example word line connection structure in a memory device.

FIG. 3 illustrates a perspective view of an example word line connection structure in a memory device. A memory device 300 comprises a stack of linking elements including a first group of linking elements (e.g. 321, 322, 323) and a second group of linking elements (e.g. 324, 325, 326) different than the first group of linking elements.

The memory device comprises a first plurality of interlayer connectors. Interlayer connectors in the first plurality of interlayer connectors (e.g. 321c, 322c, 323c) can be connected to respective linking elements in the first group of linking elements (e.g. 321, 322, 323). The memory device comprises a second plurality of interlayer connectors. Interlayer connectors in the second plurality of interlayer connectors (e.g. 324c, 325c, 326c) can be connected to respective linking elements in the second group of linking elements (e.g. 324, 325, 326).

The memory device comprises a first layer of patterned conductor lines. Patterned conductor lines in the first layer of patterned conductor lines (e.g. 321p, 322p, 323p) can be coupled to respective interlayer connectors in the first plurality of interlayer connectors (e.g. 321c, 322c, 323c). The memory device comprises a second layer of patterned conductor lines disposed higher than the first layer of patterned conductor lines. Patterned conductor lines in the second layer of patterned conductor lines (e.g. 324p, 325p, 326p) can be coupled to respective interlayer connectors in the second plurality of interlayer connectors (e.g. 324c, 325c, 326c).

The memory device comprises a third plurality of interlayer connectors (e.g. 321d, 322d, 323d, FIG. 3), and a fourth plurality of interlayer connectors (e.g. 324d, 325d, 326d). Patterned conductor lines in the first layer of patterned conductor lines (e.g. 321p, 322p, 323p) can be coupled to respective interlayer connectors in the third plurality of interlayer connectors (e.g. 321d, 322d, 323d). Patterned conductor lines in the second layer of patterned conductor lines (e.g. 324p, 325p, 326p) can be coupled to respective interlayer connectors in the fourth plurality of interlayer connectors (324d, 325d, 326d).

Figure 7:
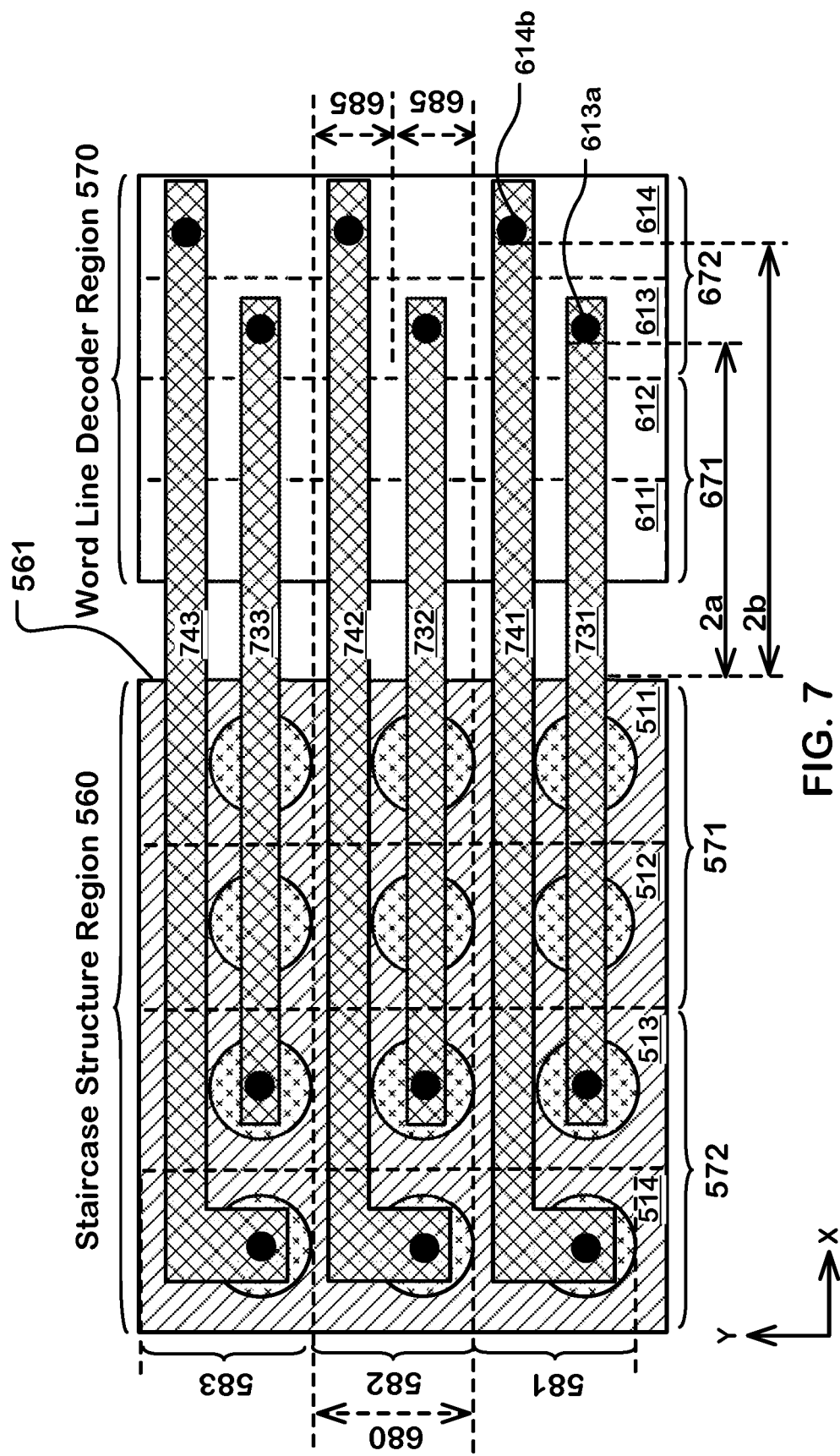
FIG. 7 illustrates a second example of arrangements for interlayer connectors, local word line drivers, and patterned conductor lines in a word line connection structure.
Figure 8:
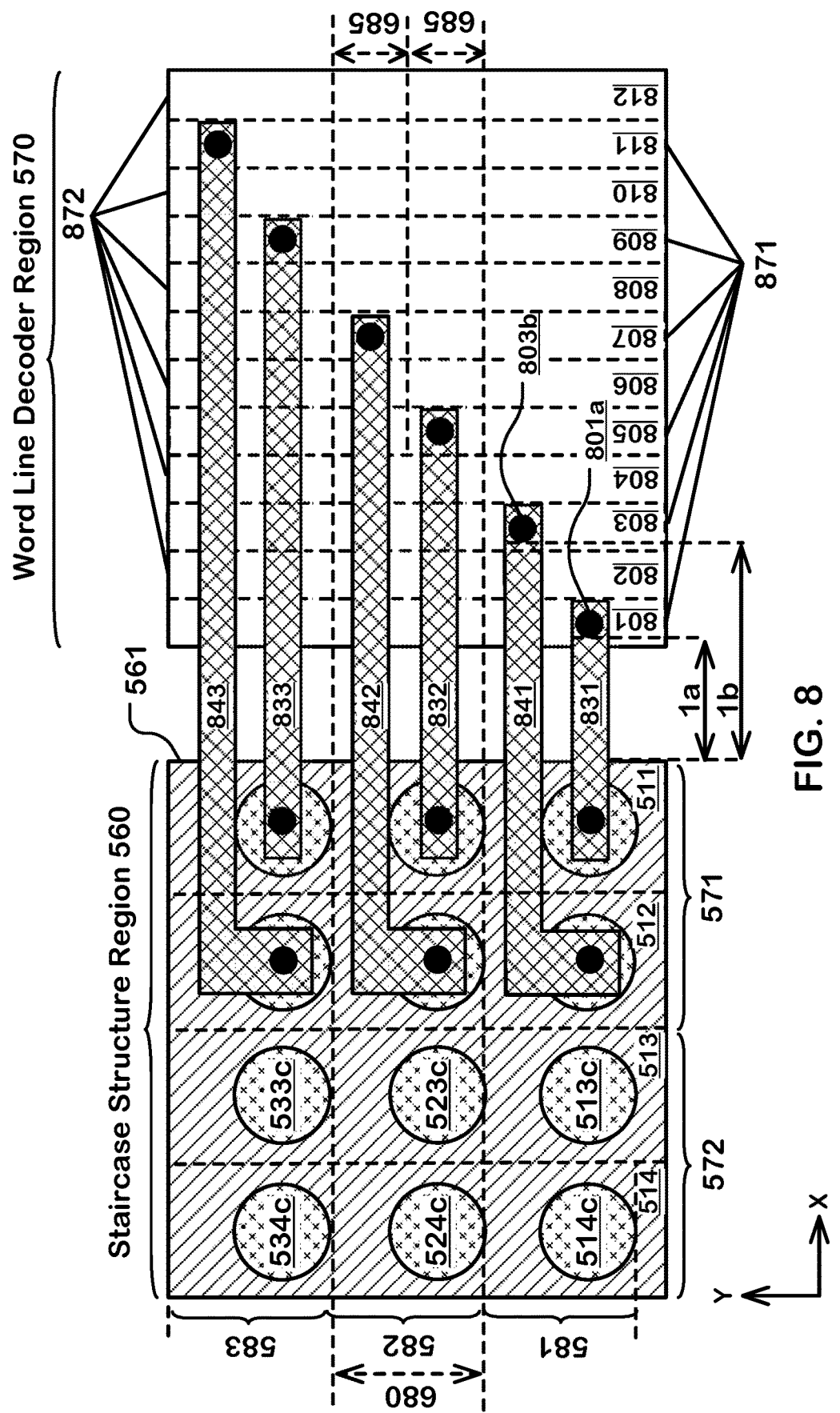
FIG. 8 illustrates a third example of arrangements for interlayer connectors, local word line drivers, and patterned conductor lines in a word line connection structure.
Figure 9:
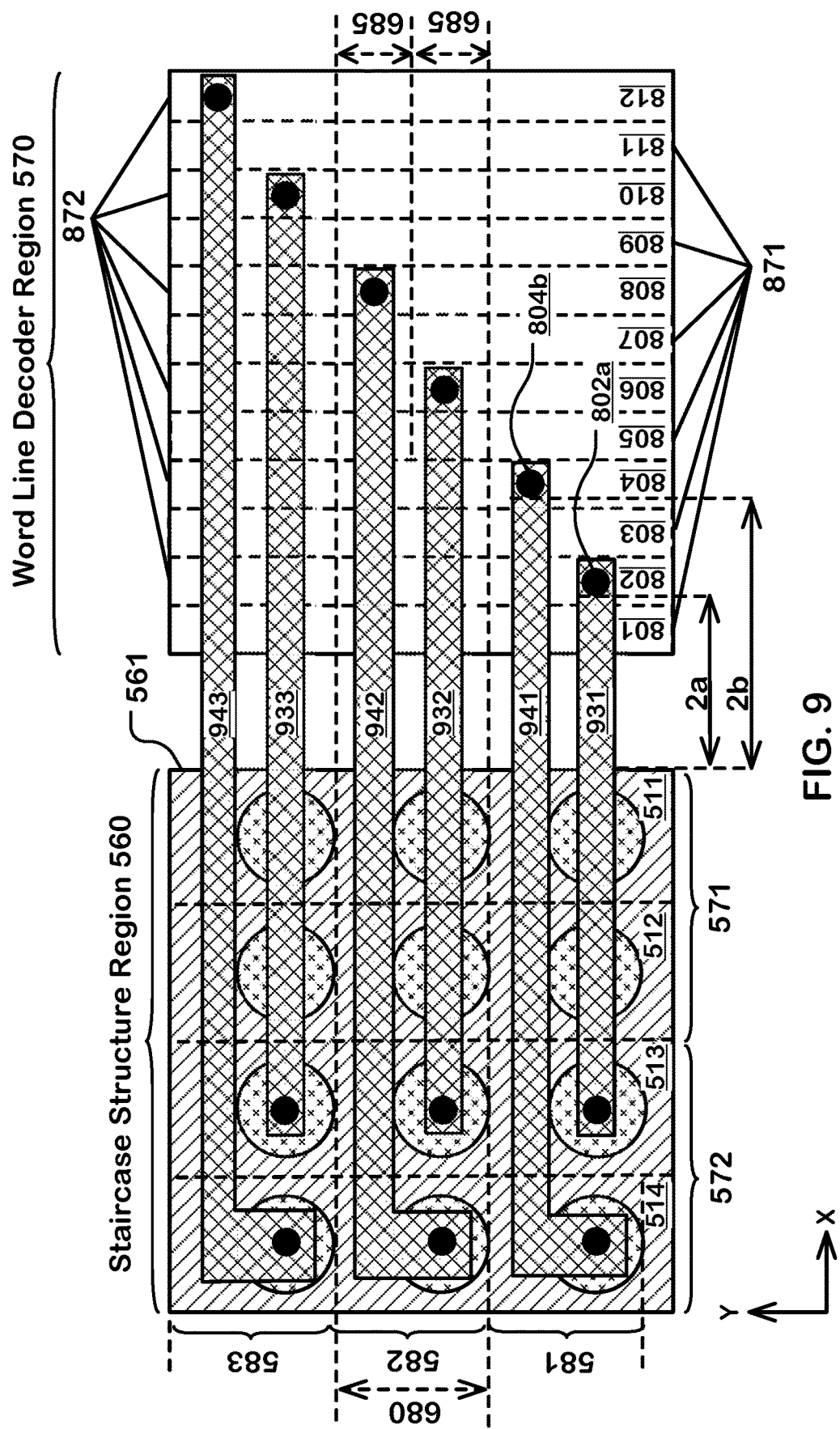
FIG. 9 illustrates a fourth example of arrangements for interlayer connectors, local word line drivers, and patterned conductor lines in a word line connection structure.

The memory device comprises a first plurality of local word line drivers as further described in reference to FIGS. 6 and 8, and a second plurality of local word line drivers as further described in reference to FIGS. 7 and 9, disposed in a word line decoder region (e.g. 570, FIGS. 6-9). Interlayer connectors in the third plurality of interlayer connectors (e.g. 321d, 322d, 323d) can be coupled to respective local word line drivers in the first plurality of local word line drivers. Interlayer connectors in the fourth plurality of interlayer connectors (e.g. 324d, 325d, 326d) can be coupled to respective local word line drivers in the second plurality of local word line drivers.

Figure 4:
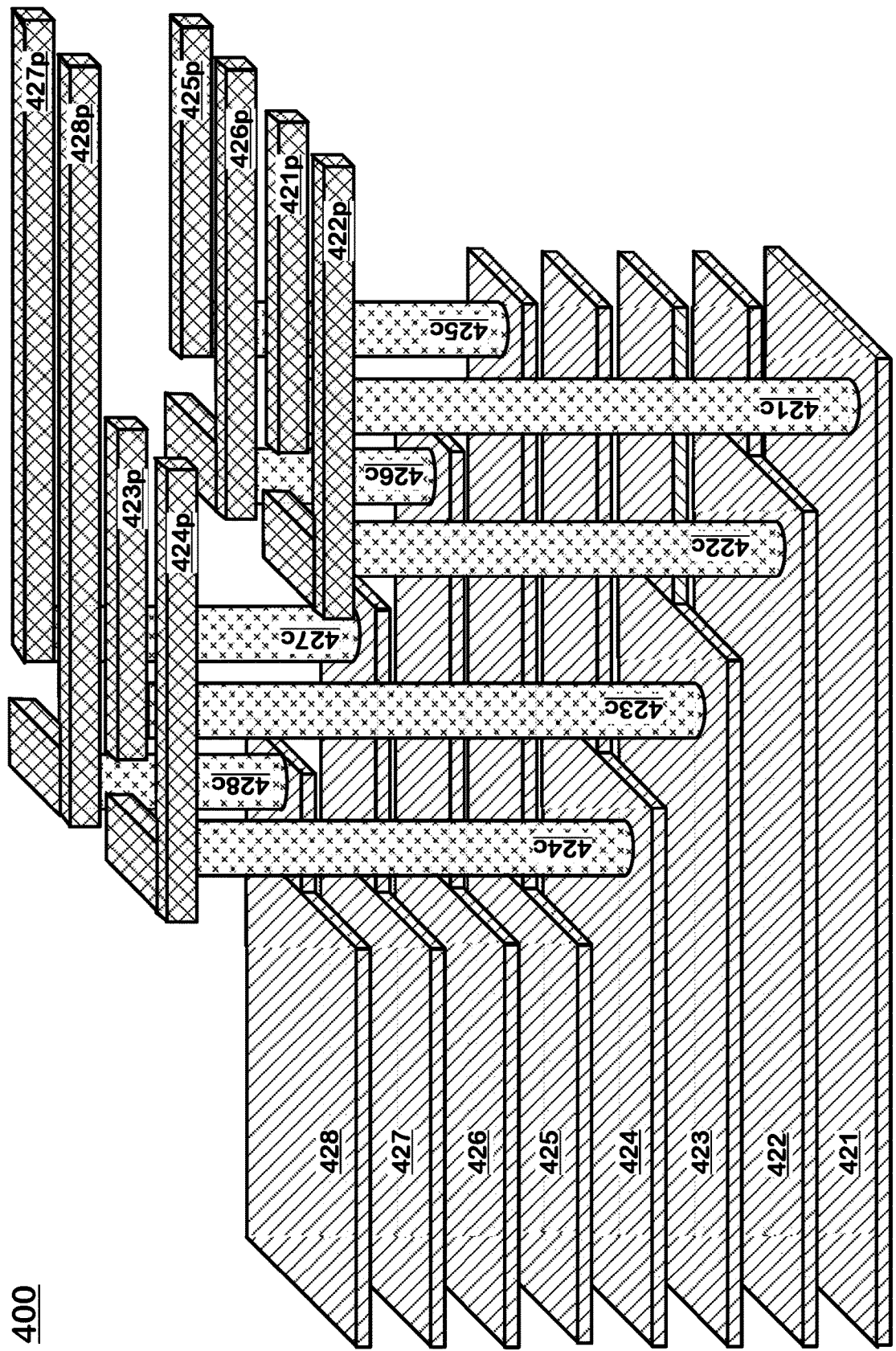
FIG. 4 illustrates a perspective view of another example word line connection structure in a memory device.

FIG. 4 illustrates a perspective view of another example word line connection structure in a memory device. A memory device 400 comprises a stack of linking elements including a first group of linking elements (e.g. 421, 422, 425, 426) and a second group of linking elements (e.g. 423, 424, 427, 428) different than the first group of linking elements.

The memory device comprises a first plurality of interlayer connectors. Interlayer connectors in the first plurality of interlayer connectors (e.g. 421c, 422c, 425c, 426c) can be connected to respective linking elements in the first group of linking elements (e.g. 421, 422, 425, 426). The memory device comprises a second plurality of interlayer connectors. Interlayer connectors in the second plurality of interlayer connectors (e.g. 423c, 424c, 427c, 428c) can be connected to respective linking elements in the second group of linking elements (e.g. 423, 424, 427, 428).

The memory device comprises a first layer of patterned conductor lines. Patterned conductor lines in the first layer of patterned conductor lines (e.g. 421p, 422p, 425p, 426p) can be coupled to respective interlayer connectors in the first plurality of interlayer connectors (e.g. 421c, 422c, 425c, 426c). The memory device comprises a second layer of patterned conductor lines disposed higher than the first layer of patterned conductor lines. Patterned conductor lines in the second layer of patterned conductor lines (e.g. 423p, 424p, 42'7p, 428p) can be coupled to respective interlayer connectors in the second plurality of interlayer connectors (e.g. 423c, 424c, 427c, 428c).

Figure 5:
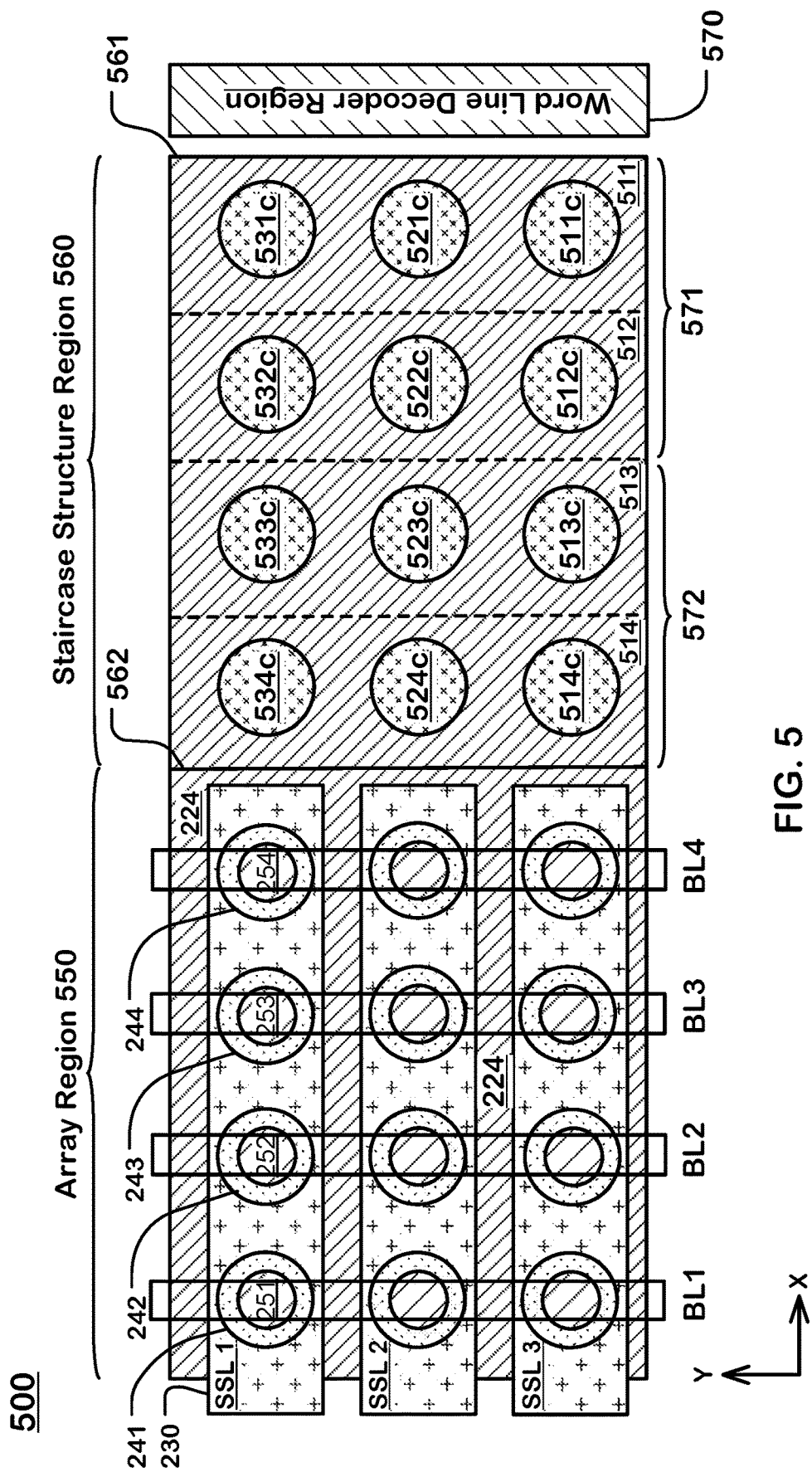
FIG. 5 illustrates a top view of an example memory device, including an array region, a staircase structure region, and a word line decoder region.

FIG. 5 illustrates a top view of an example memory device 500, including an array region 550, a staircase structure region 560, and a word line decoder region 570.

The array region 550 includes a plurality of stacks of conductive strips alternating with insulating strips, including a bottom plane of conductive strips (210, FIG. 2), a plurality of intermediate planes of conductive strips (e.g. 224), and a top plane of conductive strips 230 including string select lines SSL1, SSL2 and SSL3. A plurality of vertical channel structures (e.g. 251-254) is arranged orthogonally to the plurality of stacks of conductive strips. Memory elements (e.g. 241-244) are disposed in interface regions at crosspoints between side surfaces of the plurality of stacks and the plurality of vertical channel structures. Bit lines BL1-BL4 are coupled to vertical channel structures (e.g. 251-254) in respective columns in the plurality of vertical channel structures.

A stack of linking elements (e.g. 221b-224b, FIG. 2; 321-326, FIG. 3; 421-428, FIG. 4) is disposed in the staircase structure region 560 having a first edge 561 opposite the word line decoder region 570, and a second edge 562 opposite the first edge and in contact with the array region 550. Linking elements in the stack of linking elements are coupled to conductive strips (e.g. 221-224, FIG. 2) in respective intermediate planes in the plurality of intermediate planes in the array region.

A first plurality of interlayer connectors (e.g. 511c, 521c, 531c, 512c, 522c, 532c) is disposed in a first set of columns 571 in the staircase structure region proximal to the first edge 561. Interlayer connectors 511c, 521c and 531c are disposed in a first column 511 in the first set of columns 571, and interlayer connectors 512c, 522c and 532c are disposed in a second column 512 in the first set of columns 571.

A second plurality of interlayer connectors (e.g. 513c, 523c, 533c, 514c, 524c, 534c) is disposed in a second set of columns 572 in the staircase structure region distal to the first edge 561. Interlayer connectors 513c, 523c and 533c are disposed in a first column 513 in the second set of columns 572, and interlayer connectors 514c, 524c and 534c are disposed in a second column 514 in the second set of columns 572.

FIG. 6 illustrates a first example of arrangements for interlayer connectors, local word line drivers, and patterned conductor lines in a word line connection structure. A first plurality of local word line drivers is disposed in a first set of columns 671 in the word line decoder region 570 proximal to the first edge 561 of the staircase structure region 560, the first set of columns including adjacent columns 611 and 612.

The first set of columns 571 in the staircase structure region 560 includes a first column 511 disposed proximal to the first edge 561 of the staircase structure region 560, and a second column 512 disposed distal to the first edge 561 of the staircase structure region. The first set of columns 671 in the word line decoder region 570 includes a first column 611 disposed proximal to the first edge 561 of the staircase structure region 560, and a second column 612 disposed distal to the first edge 561 of the staircase structure region. A contact 611a of a first local word line driver in the first column 611 in the first set of columns 671 in the word line decoder region 570 is disposed a first distance 1a from the first edge 561 of the staircase structure region 560. A contact 612b of a second local word line driver in the second column 612 in the first set of columns 671 in the word line decoder region 570 is disposed a second distance 1b from the first edge 561 of the staircase structure region 560. The second distance 1b is greater than the first distance 1a.

Patterned conductor lines in a first set of patterned conductor lines (e.g. 631, 632, 633) in the first layer of patterned conductor lines are coupled to respective interlayer connectors disposed in the first column 511 of the first set of columns 571 in the staircase structure region, and coupled to respective local word line drivers disposed in the first column 611 of the first set of columns 671 in the word line decoder region.

Patterned conductor lines in a second set of patterned conductor lines (e.g. 641, 642, 643) in the first layer of patterned conductor lines are coupled to respective interlayer connectors disposed in the second column 512 of the first set of columns 571 in the staircase structure region, and coupled to respective local word line drivers disposed in the second column 612 of the first set of columns 671 in the word line decoder region.

Interlayer connectors in the first plurality of interlayer connectors (e.g. 511c, 521c, 531c, 512c, 522c, 532c, FIG. 5) disposed in the first set of columns 571 and in the second plurality of interlayer connectors (e.g. 513c, 523c, 533c, 514c, 524c, 534c) disposed in the second set of columns 572 are disposed in a set of rows arranged in a row direction (X-direction) in the staircase structure region 560. In this example, interlayer connectors 514c, 513c, 512c and 511c are disposed in row 581, interlayer connectors 524c, 523c, 522c and 521c are disposed in row 582, and interlayer connectors 534c, 533c, 532c and 531c are disposed in row 583.

Rows in the set of rows have a first pitch 680 in a column direction (Y-direction) orthogonal to the row direction. Patterned conductor lines in the first layer of patterned conductor lines (e.g. 631-633, 641-643) extend in the row direction, and have a second pitch 685 in the column direction. The second pitch 685 has half a size of the first pitch 680.

FIG. 7 illustrates a second example of arrangements for interlayer connectors, local word line drivers, and patterned conductor lines in a word line connection structure. A second plurality of local word line drivers is disposed in a second set of columns 672 in the word line decoder region 570 distal to the first edge 561 of the staircase structure region 560, the second set of columns including adjacent columns 613 and 614.

The second set of columns 572 in the staircase structure region 560 includes a first column 513 disposed proximal to the first edge 561 of the staircase structure region 560, and a second column 514 disposed distal to the first edge 561 of the staircase structure region. The second set of columns 672 in the word line decoder region 570 includes a first column 613 disposed proximal to the first edge 561 of the staircase structure region 560, and a second column 614 disposed distal to the first edge 561 of the staircase structure region. A contact 613a of a first local word line driver in the first column 613 in the second set of columns 672 in the word line decoder region 570 is disposed a third distance 2a from the first edge 561 of the staircase structure region 560. A contact 614b of a second local word line driver in the second column 614 in the second set of columns 672 in the word line decoder region 570 is disposed a fourth distance 2b from the first edge 561 of the staircase structure region 560. The fourth distance 2b is greater than the third distance 2a. The third distance 2a is greater than the second distance 1b (FIG. 6).

Patterned conductor lines in a first set of patterned conductor lines (e.g. 731, 732, 733) in the second layer of patterned conductor lines higher than the first layer of patterned conductor lines are coupled to respective interlayer connectors disposed in the first column 513 of the second set of columns 572 in the staircase structure region, and coupled to respective local word line drivers disposed in the first column 613 of the second set of columns 672 in the word line decoder region.

Patterned conductor lines in a second set of patterned conductor lines (e.g. 741, 742, 743) in the second layer of patterned conductor lines higher than the first layer of patterned conductor lines are coupled to respective interlayer connectors disposed in the second column 514 of the second set of columns 572 in the staircase structure region, and coupled to respective local word line drivers disposed in the second column 614 of the second set of columns 672 in the word line decoder region.

Rows in the set of rows (581, 582, 583) have the first pitch 680 in a column direction (Y-direction) orthogonal to the row direction, as described in reference to FIG. 6. Patterned conductor lines in the second layer of patterned conductor lines (e.g. 731-733, 741-743) extend in the row direction, and have the second pitch 685 in the column direction. The second pitch 685 has half a size of the first pitch 680.

FIG. 8 illustrates a third example of arrangements for interlayer connectors, local word line drivers, and patterned conductor lines in a word line connection structure. A first plurality of local word line drivers is disposed in a first set of columns 871 (e.g. 801, 803, 805, 807, 809, 811) in the word line decoder region, including a first column 801 proximal to the first edge 561 of the staircase structure region 560. A second plurality of local word line drivers is disposed in a second set of columns 872 (e.g. 802, 804, 806, 808, 810, 812) in the word line decoder region, including a second column 802 adjacent the first column 801 and distal to the first edge 561 of the staircase structure region 560. Columns in the first set of columns 871 alternate with columns in the second set of columns 872. For instance, the second column 802 in the second set of columns 872 is disposed between the first column 801 and the third column 803 in the first set of columns 871.

A contact 801*a* of a first local word line driver in the first column 801 in the first set of columns 871 in the word line decoder region 570 is disposed a first distance 1*a* from the first edge 561 of the staircase structure region 560. A contact 803*b* of a third local word line driver in the third column 803 in the first set of columns 871 in the word line decoder region 570 is disposed a third distance 1*b* from the first edge 561 of the staircase structure region 560. The third distance 1*b* is greater than the first distance 1*a*. A second distance 2*a* and a fourth distance 2*b* are described in reference to FIG. 9.

The first set of columns 571 in the staircase structure region 560 can include a first column 511 disposed proximal to the first edge 561 of the staircase structure region 560, and a second column 512 disposed distal to the first edge 561 of the staircase structure region.

Patterned conductor lines in the first layer of patterned conductor lines (e.g. 831, 841, 832, 842, 833, 843) can be coupled to respective interlayer connectors disposed in the first set of columns 571 in the staircase structure region, and coupled to respective local word line drivers disposed in the first set of columns (e.g. 801, 803, 805, 807, 809, 811) in the word line decoder region.

Rows in the set of rows (581, 582, 583) have the first pitch 680 in a column direction (Y-direction) orthogonal to the row direction, as described in reference to FIG. 6. Patterned conductor lines in the first layer of patterned conductor lines (e.g. 831-833, 841-843) extend in the row direction, and have the second pitch 685 in the column direction. The second pitch 685 has half a size of the first pitch 680.

FIG. 9 illustrates a fourth example of arrangements for interlayer connectors, local word line drivers, and patterned conductor lines in a word line connection structure. A first plurality of local word line drivers is disposed in a first set of columns 871 (e.g. 801, 803, 805, 807, 809, 811) in the word line decoder region, including a first column 801 proximal to the first edge 561 of the staircase structure region 560. A second plurality of local word line drivers is disposed in a second set of columns 872 (e.g. 802, 804, 806, 808, 810, 812) in the word line decoder region, including a second column 802 adjacent the first column 801 and distal to the first edge 561 of the staircase structure region 560. Columns in the first set of columns 871 alternate with columns in the second set of columns 872. For instance, the third column 803 in the first set of columns 871 is disposed between the second column 802 and the fourth column 804 in the second set of columns 872.

A contact 802*a* of a second local word line driver in the second column 802 in the second set of columns 872 in the word line decoder region 570 is disposed a second distance 2*a* from the first edge 561 of the staircase structure region 560. A contact 804*b* of a fourth local word line driver in the fourth column 804 in the second set of columns 872 in the word line decoder region 570 is disposed a fourth distance 2*b* from the first edge 561 of the staircase structure region 560. The fourth distance 2*b* is greater than the third distance 1*b* (FIG. 8), which is greater than the second distance 2*a*, which is greater than the first distance 1*a* (FIG. 8).

The second set of columns 572 in the staircase structure region 560 can include a first column 513 disposed proximal to the first edge 561 of the staircase structure region 560, and a second column 514 disposed distal to the first edge 561 of the staircase structure region.

Patterned conductor lines in the second layer of patterned conductor lines (e.g. 931, 941, 932, 942, 933, 943) can be coupled to respective interlayer connectors disposed in the second set of columns 572 in the staircase structure region, and coupled to respective local word line drivers disposed in the second set of columns (e.g. 802, 804, 806, 808, 810, 812) in the word line decoder region.

Rows in the set of rows (581, 582, 583) have the first pitch 680 in a column direction (Y-direction) orthogonal to the row direction, as described in reference to FIG. 6. Patterned conductor lines in the second layer of patterned conductor lines (e.g. 931-933, 941-943) extend in the row direction, and have the second pitch 685 in the column direction. The second pitch 685 has half a size of the first pitch 680.

Figure 10:
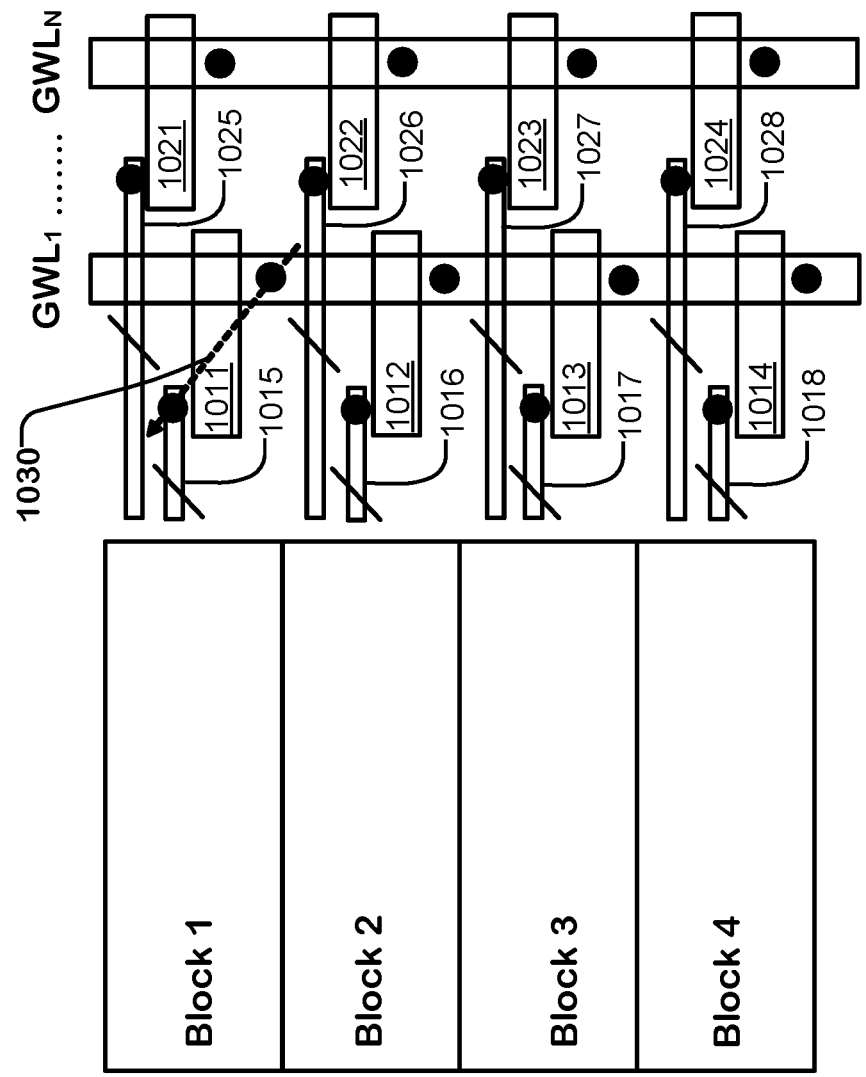
FIG. 10 is a top view of an example memory device including global word lines coupled to local word line drivers.

FIG. 10 is a top view of an example memory device including global word lines coupled to local word line drivers. FIG. 10 illustrates a plurality of blocks Block 1, Block 2, Block 3 and Block 4. Blocks in the plurality of blocks include respective stacks of conductive strips in a plurality of stacks of conductive strips including a plurality of intermediate planes of conductive strips (e.g. 221-224, FIG. 2). Linking elements in a plurality of stacks of linking elements (e.g. 221*b*-224*b*, FIG. 2; 321-326, FIG. 3) are coupled to conductive strips in respective intermediate planes in the plurality of intermediate planes in respective blocks in the plurality of blocks. A block decoder (1150, FIG. 1) selects on which block to execute a read, erase or program operation.

FIG. 10 illustrates a plurality of global word lines (e.g. $GWL_1, \ldots GWL_N$). Global word lines (e.g. $GWL_1$, GWLn) in the plurality of global word lines are coupled to local word line drivers (e.g. 1011-1014, 1021-2014) coupled to linking elements coupled to conductive strips in respective intermediate planes in blocks in the plurality of blocks, via word line connection structures (e.g. 1015-1018, 1025-1028). The local word line drivers can include the first plurality of local word line drivers and the second plurality of local word line drivers disposed in the word line decoder region (570, FIGS. 6-9).

The word line connection structures (e.g. 1015-1018, 1025-1028) can include a first plurality of interlayer connectors (e.g. 321c, 322c, 323c, FIG. 3), a second plurality of interlayer connectors (e.g. 324c, 325c, 326c, FIG. 3), a third plurality of interlayer connectors (e.g. 321d, 322d, 323d, FIG. 3), a fourth plurality of interlayer connectors (e.g. 324d, 325d, 326d, FIG. 3), a first layer of patterned conductor lines (e.g. 321p, 322p, 323p, FIG. 3), and a second layer of patterned conductor lines (e.g. 324p, 325p, 326p, FIG. 3) higher than the first layer of patterned conductor lines, as described herein.

When a local word line driver (e.g. 1011) is turned on, a signal (e.g. 1030) can be passed from a global word line (e.g. $GWL_1$), through the local word line driver, to a word line connection structure (e.g. 1015). The word line connection structure can include a patterned conductor line in a first layer of patterned conductor lines or a second of patterned conductor lines higher than the first layer of patterned conductor lines.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of manufacturing a memory device, comprising:
    forming a stack of linking elements including a first group of linking elements and a second group of linking elements different than the first group of linking elements;
    forming a first plurality of interlayer connectors, interlayer connectors in the first plurality of interlayer connectors connected to respective linking elements in the first group of linking elements;
    forming a second plurality of interlayer connectors, interlayer connectors in the second plurality of interlayer connectors connected to respective linking elements in the second group of linking elements;
    forming a first layer of patterned conductor lines, patterned conductor lines in the first layer of patterned conductor lines coupled to respective interlayer connectors in the first plurality of interlayer connectors; and
    forming a second layer of patterned conductor lines disposed higher than and overlying the first layer of patterned conductor lines, patterned conductor lines in the second layer of patterned conductor lines coupled to respective interlayer connectors in the second plurality of interlayer connectors.

2. The memory device of claim 1, wherein
    interlayer connectors in the first plurality of interlayer connectors and in the second plurality of interlayer connectors are disposed in a set of rows arranged in a row direction in a staircase structure region, rows in the set of rows having a first pitch in a column direction orthogonal to the row direction; and
    patterned conductor lines in the first layer of patterned conductor lines and in the second layer of patterned conductor lines extend in the row direction and have a second pitch in the column direction, the second pitch having half a size of the first pitch.

3. The memory device of claim 1, comprising:
    forming a first plurality of local word line drivers and a second plurality of local word line drivers disposed in a word line decoder region;
    forming a third plurality of interlayer connectors, interlayer connectors in the third plurality of interlayer connectors coupled to respective local word line drivers in the first plurality of local word line drivers;
    forming a fourth plurality of interlayer connectors, interlayer connectors in the fourth plurality of interlayer connectors coupled to respective local word line drivers in the second plurality of local word line drivers, wherein
    forming patterned conductor lines in the first layer of patterned conductor lines are coupled to respective interlayer connectors in the third plurality of interlayer connectors and forming patterned conductor lines in the second layer of patterned conductor lines are coupled to respective interlayer connectors in the fourth plurality of interlayer connectors.

4. The memory device of claim 3, wherein
    the stack of linking elements is disposed in a staircase structure region having a first edge opposite the word line decoder region;
    the first plurality of interlayer connectors is disposed in a first set of columns in the staircase structure region proximal to the first edge; and
    the second plurality of interlayer connectors is disposed in a second set of columns in the staircase structure region distal to the first edge.

5. The memory device of claim 4, wherein
    the first plurality of local word line drivers is disposed in a first set of columns in the word line decoder region proximal to the first edge of the staircase structure region, the first set of columns including adjacent columns; and
    the second plurality of local word line drivers is disposed in a second set of columns in the word line decoder region distal to the first edge of the staircase structure region, the second set of columns including adjacent columns.

6. The memory device of claim 4, wherein
    the first plurality of local word line drivers is disposed in a first set of columns in the word line decoder region, including a first column proximal to the first edge of the staircase structure region; and
    the second plurality of local word line drivers is disposed in a second set of columns in the word line decoder region, including a second column adjacent the first column and distal to the first edge of the staircase structure region, columns in the first set of columns alternating with columns in the second set of columns;
    patterned conductor lines in the first layer of patterned conductor lines are coupled to respective interlayer connectors disposed in the first set of columns in the staircase structure region, and coupled to respective local word line drivers disposed in the first set of columns in the word line decoder region; and
    patterned conductor lines in the second layer of patterned conductor lines are coupled to respective interlayer connectors disposed in the second set of columns in the staircase structure region, and coupled to respective local word line drivers disposed in the second set of columns in the word line decoder region.

7. The memory device of claim 4, wherein the first set of columns in the staircase structure region includes a first column disposed proximal to the first edge of the staircase structure region, and a second column disposed distal to the first edge of the staircase structure region;

the first set of columns in the word line decoder region includes a first column disposed proximal to the first edge of the staircase structure region, and a second column disposed distal to the first edge of the staircase structure region;

patterned conductor lines in a first set of patterned conductor lines in the first layer of patterned conductor lines are coupled to respective interlayer connectors disposed in the first column of the first set of columns in the staircase structure region, and coupled to respective local word line drivers disposed in the first column of the first set of columns in the word line decoder region; and patterned conductor lines in a second set of patterned conductor lines in the first layer of patterned conductor lines are coupled to respective interlayer connectors disposed in the second column of the first set of columns in the staircase structure region, and coupled to respective local word line drivers disposed in the second column of the first set of columns in the word line decoder region.

8. The memory device of claim 4, wherein the second set of columns in the staircase structure region includes a first column disposed proximal to the first edge of the staircase structure region, and a second column disposed distal to the first edge of the staircase structure region;

the second set of columns in the word line decoder region includes a first column disposed proximal to the first edge of the staircase structure region, and a second column disposed distal to the first edge of the staircase structure region;

patterned conductor lines in a first set of patterned conductor lines in the second layer of patterned conductor lines higher than the first layer of patterned conductor lines are coupled to respective interlayer connectors disposed in the first column of the second set of columns in the staircase structure region, and coupled to respective local word line drivers disposed in the first column of the second set of columns in the word line decoder region; and patterned conductor lines in a second set of patterned conductor lines in the second layer of patterned conductor lines higher than the first layer of patterned conductor lines are coupled to respective interlayer connectors in the second column of the second set of columns in the staircase structure region, and coupled to respective local word line drivers in the second column of the second set of columns in the word line decoder region.

9. The memory device of claim 3, comprising:

forming a plurality of stacks of conductive strips alternating with insulating strips, including a bottom plane of conductive strips, a plurality of intermediate planes of conductive strips, and a top plane of conductive strips;

forming a plurality of blocks, blocks in the plurality of blocks including respective stacks of conductive strips in the plurality of stacks of conductive strips;

forming a plurality of stacks of linking elements including the first-mentioned stack of linking elements, linking elements in the plurality of stacks of linking elements coupled to conductive strips in respective intermediate planes in the plurality of intermediate planes in respective blocks in the plurality of blocks; and forming a plurality of global word lines, global word lines in the plurality of global word lines coupled to local word line drivers coupled to linking elements coupled to conductive strips in respective intermediate planes in blocks in the plurality of blocks, the local word line drivers including the first plurality of local word line drivers and the second plurality of local word line drivers disposed in the word line decoder region.

10. The memory device of claim 1, comprising:

forming a plurality of stacks of conductive strips alternating with insulating strips, including a bottom plane of conductive strips, a plurality of intermediate planes of conductive strips, and a top plane of conductive strips;

forming a plurality of vertical channel structures arranged orthogonally to the plurality of stacks of conductive strips; and forming memory elements in interface regions at crosspoints between side surfaces of the plurality of stacks and the plurality of vertical channel structures, wherein linking elements in the stack of linking elements are coupled to conductive strips in respective intermediate planes in the plurality of intermediate planes.

* * * * *